United States Patent
Chen et al.

(10) Patent No.: US 12,136,621 B2
(45) Date of Patent: Nov. 5, 2024

(54) BIDIRECTIONAL ELECTROSTATIC DISCHARGE (ESD) PROTECTION DEVICE

(71) Applicant: AMAZING MICROELECTRONIC CORP., New Taipei (TW)

(72) Inventors: Chih-Wei Chen, Zhubei (TW); Mei-Lian Fan, Hsinchu (TW); Kun-Hsien Lin, Hsinchu (TW)

(73) Assignee: Amazing Microelectronic Corp., New Taipei (TW)

( * ) Notice: Subject to any disclaimer, the term of this patent is extended or adjusted under 35 U.S.C. 154(b) by 494 days.

(21) Appl. No.: 17/647,627

(22) Filed: Jan. 11, 2022

(65) Prior Publication Data
US 2023/0223398 A1 Jul. 13, 2023

(51) Int. Cl.
*H01L 27/02* (2006.01)
(52) U.S. Cl.
CPC ................. *H01L 27/0262* (2013.01)
(58) Field of Classification Search
None
See application file for complete search history.

(56) References Cited

U.S. PATENT DOCUMENTS

| | | |
|---|---|---|
| 7,875,933 B2 | 1/2011 | Schneider et al. |
| 8,350,355 B2 | 1/2013 | Esmark |
| 8,431,999 B2 | 4/2013 | Shen et al. |
| 8,552,530 B2 | 10/2013 | Lin et al. |
| 9,640,527 B2 | 5/2017 | Lin et al. |
| 10,468,513 B1 | 11/2019 | Chen et al. |
| 10,573,635 B2 | 2/2020 | Chen et al. |
| 2020/0058636 A1 | 2/2020 | Lin et al. |
| 2022/0200272 A1* | 6/2022 | Yeh .............. H02H 9/046 |

* cited by examiner

*Primary Examiner* — Kyoung Lee
(74) *Attorney, Agent, or Firm* — Rosenberg, Klein & Lee (57) ABSTRACT

A bidirectional electrostatic discharge protection device includes at least one bipolar junction transistor and at least one silicon-controlled rectifier. The silicon-controlled rectifier is coupled to the bipolar junction transistor in series. The absolute value of the breakdown voltage of the bipolar junction transistor is lower than that of the silicon-controlled rectifier and the absolute value of the holding voltage of the bipolar junction transistor is higher than that of the silicon-controlled rectifier when an electrostatic discharge voltage is applied to the bipolar junction transistor and the silicon-controlled rectifier.

15 Claims, 6 Drawing Sheets

BIDIRECTIONAL ELECTROSTATIC DISCHARGE (ESD) PROTECTION DEVICE

BACKGROUND OF THE INVENTION

Field of the Invention

The present invention relates to the electrostatic discharge (ESD) technology, particularly to a bidirectional electrostatic discharge (ESD) protection device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
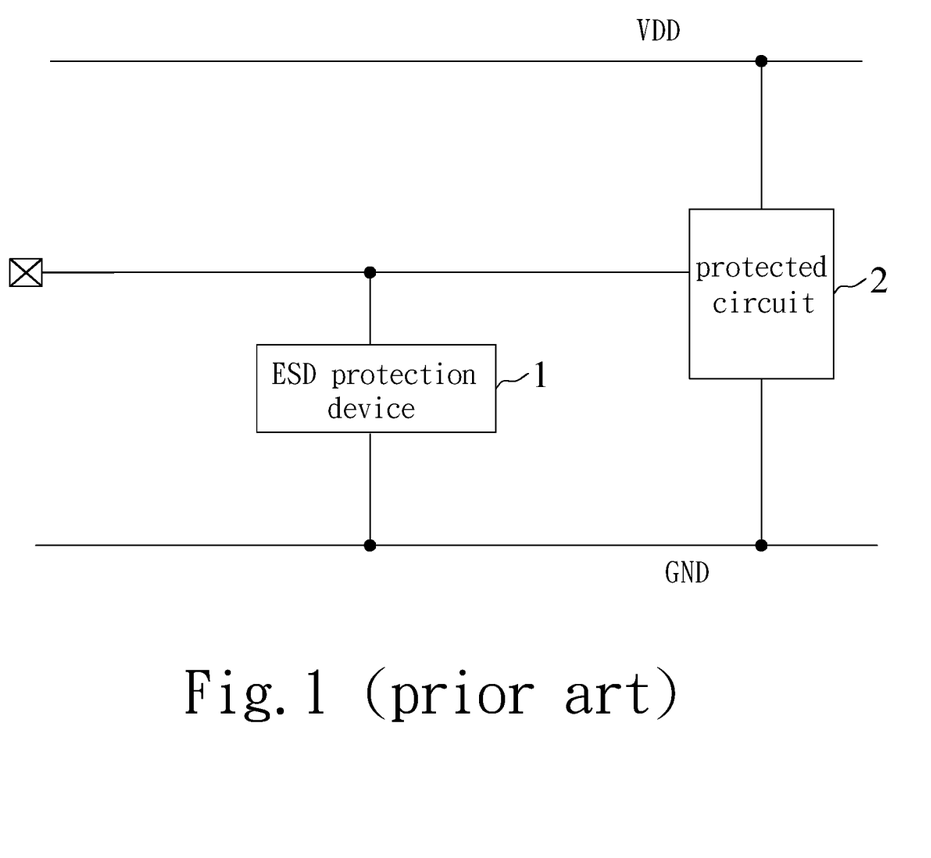
FIG. 1 is a schematic diagram illustrating an ESD protection device connected with a protected circuit on an IC chip in the conventional technology.

The working principle of ESD protection device is shown in FIG. 1. In FIG. 1, the ESD protection device 1 is connected in parallel with a protected circuit 2 on the IC chip. The ESD protection device 1 would be triggered immediately when the ESD event occurs. In that way, the ESD protection device 1 can provide a superiorly low resistance path for discharging the transient ESD current, so that the energy of the ESD transient current can be bypassed by the ESD protection device 1. For achieving the bidirectional ESD purpose, a bidirectional transient voltage suppressor is implemented in the U.S. Pat. Nos. 10,573,635 B2 and 10,468,513 B1. The U.S. Pat. No. 10,573,635 B2 disclosed two bipolar junction transistors connected in series. The U.S. Pat. No. 10,468,513 B1 disclosed a silicon-controlled rectifier. In implementation, the holding voltages and the breakdown voltages of the bipolar junction transistor and the silicon-controlled rectifier are higher than the operating voltage of a protected device, such that the latch-up event is avoided. However, when the bipolar junction transistor is designed to have a required breakdown voltage, the holding voltage of the bipolar junction transistor is too high. Thus, the bipolar junction transistor has a higher ON resistance when the ESD event occurs. When the silicon-controlled rectifier is designed to have a required holding voltage, the breakdown voltage of the silicon-controlled rectifier is too high.

To overcome the abovementioned problems, the present invention provides a bidirectional electrostatic discharge (ESD) protection device, so as to solve the afore-mentioned problems of the prior art.

SUMMARY OF THE INVENTION

The present invention provides a bidirectional electrostatic discharge (ESD) protection device, which has a lower clamping voltage and lower holding voltage that are still higher than the operating voltage of a protected device when a required breakdown voltage is designed without sacrificing the ESD robustness and without suffering the latch-up event.

The present invention provides a bidirectional electrostatic discharge (ESD) protection device, which includes at least one bipolar junction transistor and at least one silicon-controlled rectifier. The silicon-controlled rectifier is coupled to the bipolar junction transistor in series. The absolute value of the breakdown voltage of the bipolar junction transistor is lower than that of the silicon-controlled rectifier and the absolute value of the holding voltage of the bipolar junction transistor is higher than that of the silicon-controlled rectifier when an electrostatic discharge voltage is applied to the bipolar junction transistor and the silicon-controlled rectifier.

In an embodiment of the present invention, the bipolar junction transistor and the silicon-controlled rectifier have a first representative current-voltage curve when a positive electrostatic discharge voltage is applied to the bipolar junction transistor and the silicon-controlled rectifier. The bipolar junction transistor and the silicon-controlled rectifier have a second representative current-voltage curve when a negative electrostatic discharge voltage is applied to the bipolar junction transistor and the silicon-controlled rectifier. The first representative current-voltage curve is symmetric or asymmetric to the second representative current-voltage curve with zero voltage as a center. The first representative current-voltage curve has a first breakdown voltage, a first holding voltage, and a first clamping voltage. The second representative current-voltage curve has a second breakdown voltage, a second holding voltage, and a second clamping voltage.

In an embodiment of the present invention, the absolute values of the second breakdown voltage, the second holding voltage, and the second clamping voltage are respectively equal to the first breakdown voltage, the first holding voltage, and the first clamping voltage.

In an embodiment of the present invention, the bidirectional electrostatic discharge protection device further includes a semiconductor substrate and an isolation structure. The semiconductor substrate has a first conductivity type. An epitaxial layer is formed on the semiconductor substrate. The epitaxial layer has a second conductivity type opposite to the first conductivity type. The bipolar junction transistor, a first doped well, and at least one second doped well are formed in the epitaxial layer. The first doped well and the second doped well have the first conductivity type. A first heavily-doped area and a second heavily-doped area are formed in the first doped well. The first heavily-doped area and the second heavily-doped area respectively have the second conductivity type and the first conductivity type. At least one third heavily-doped area and at least one fourth heavily-doped area are formed in the second doped well. The third heavily-doped area and the fourth heavily-doped area respectively have the first conductivity type and the second conductivity type. The epitaxial layer, the first doped well, the second doped well, the first heavily-doped area, the second heavily-doped area, the third heavily-doped area, and the fourth heavily-doped area form the silicon-controlled rectifier. The bipolar junction transistor is coupled to the first heavily-doped area and the second heavily-doped area through an external conductive trace. The isolation structure, formed in the epitaxial layer and between the silicon-controlled rectifier and the bipolar junction transistor, touches the semiconductor substrate and separates the silicon-controlled rectifier from the bipolar junction transistor. The bottom position of the isolation structure is equal to or deeper than that of the epitaxial layer.

In an embodiment of the present invention, the isolation structure is formed in the semiconductor substrate.

In an embodiment of the present invention, the isolation structure surrounds the silicon-controlled rectifier and the bipolar junction transistor.

In an embodiment of the present invention, the bidirectional electrostatic discharge protection device further includes a heavily-doped buried layer formed between the semiconductor substrate and the epitaxial layer and formed under the bipolar junction transistor and the silicon-controlled rectifier. The heavily-doped buried layer has the second conductivity type. The isolation structure penetrates through the heavily-doped buried layer.

In an embodiment of the present invention, the first conductivity type is an N type and the second conductivity type is a P type.

In an embodiment of the present invention, the first conductivity type is a P type and the second conductivity type is an N type.

In an embodiment of the present invention, the bipolar junction transistor includes at least one third doped well, at least one fifth heavily-doped area, and at least one sixth heavily-doped area. The third doped well is formed in the epitaxial layer. The fifth heavily-doped area and the sixth heavily-doped area are formed in the third doped well. The conductivity types of the fifth heavily-doped area and the sixth heavily-doped area are opposite to the conductivity type of the third doped well. The sixth heavily-doped area is coupled to the external conductive trace.

In an embodiment of the present invention, the fifth heavily-doped area is coupled to a first pin and the third heavily-doped area and the fourth heavily-doped area are coupled to a second pin.

In an embodiment of the present invention, an electrostatic discharge current sequentially flows through the fifth heavily-doped area, the third doped well, the sixth heavily-doped area, the external conductive trace, the first heavily-doped area, the first doped well, the epitaxial layer, the second doped well, and the third heavily-doped area when the positive electrostatic discharge voltage is applied to the first pin and the second pin.

In an embodiment of the present invention, an electrostatic discharge current sequentially flows through the fourth heavily-doped area, the second doped well, the epitaxial layer, the first doped well, the second heavily-doped area, the external conductive trace, the sixth heavily-doped area, the third doped well, and the fifth heavily-doped area when the negative electrostatic discharge voltage is applied to the first pin and the second pin.

In an embodiment of the present invention, the at least one bipolar junction transistor includes a plurality of bipolar junction transistors.

In an embodiment of the present invention, the at least one silicon-controlled rectifier includes a plurality of silicon-controlled rectifiers.

To sum up, the bidirectional ESD protection device couples the bipolar junction transistor to the silicon-controlled rectifier in series to have a lower clamping voltage and lower holding voltage that are still higher than the operating voltage of a protected device, when a required breakdown voltage is designed without sacrificing the ESD robustness and without suffering the latch-up event.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a bidirectional electrostatic discharge (ESD) protection device will be provided. The bidirectional ESD protection device couples the bipolar junction transistor to the silicon-controlled rectifier in series to have a lower clamping voltage and lower holding voltage that are still higher than the operating voltage of a protected device, when a required breakdown voltage is designed without sacrificing the ESD robustness and without suffering the latch-up event.

Figure 2:
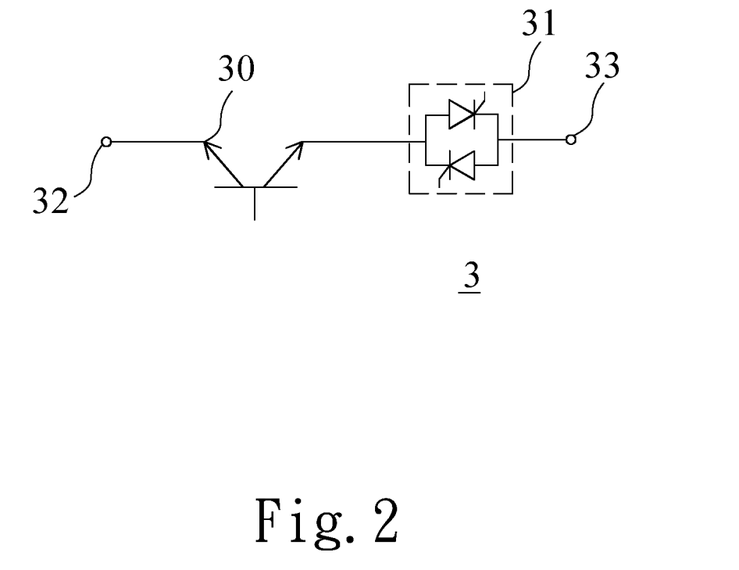
FIG. 2 is a schematic diagram illustrating a bidirectional electrostatic discharge (ESD) protection device according to a first embodiment of the present invention.
Figure 3:
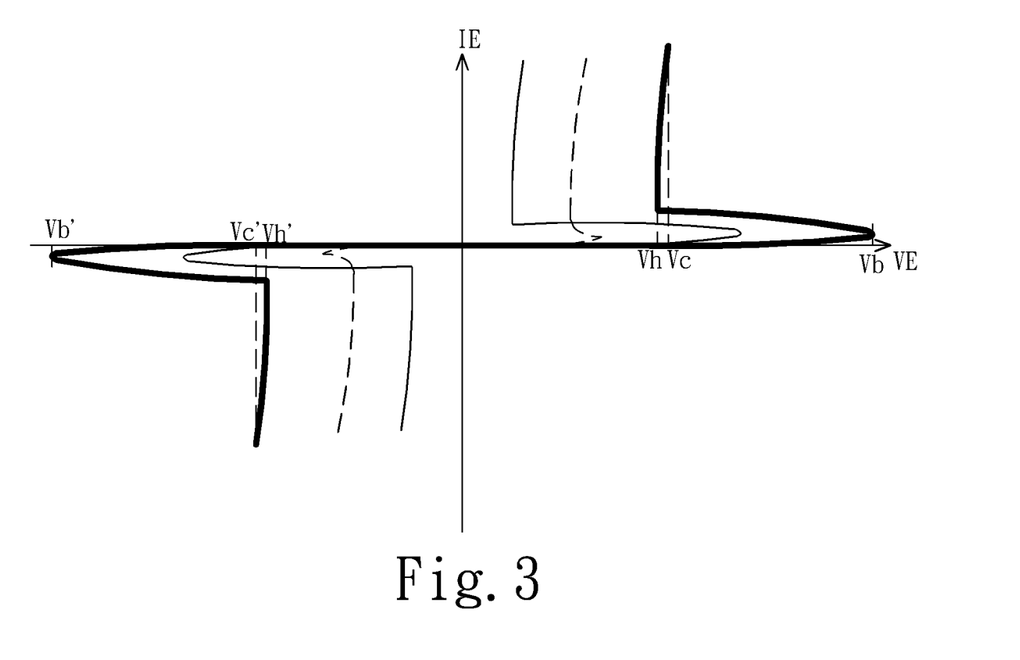
FIG. 3 is an I-V curve of a bidirectional ESD protection device according to an embodiment of the present invention.

FIG. 2 is a schematic diagram illustrating a bidirectional electrostatic discharge (ESD) protection device according to a first embodiment of the present invention. FIG. 3 is an I-V curve of a bidirectional ESD protection device according to an embodiment of the present invention. Referring to FIG. 2 and FIG. 3, the bidirectional ESD protection device 3 includes at least one bipolar junction transistor 30 and at least one silicon-controlled rectifier 31. For clarity and convenience, the first embodiment exemplifies one bipolar junction transistor 30 and one silicon-controlled rectifier 31. In another embodiment, one or more bipolar junction transistors and one or more silicon-controlled rectifiers may be used for higher voltage applications. The silicon-controlled rectifier 31 is coupled to the bipolar junction transistor 30 in series. The bipolar junction transistor 30 is an NPN bipolar junction transistor or a PNP bipolar junction transistor. The base of the bipolar junction transistor 30 is floating. The bipolar junction transistor 30 and the silicon-controlled rectifier 31 are respectively coupled to a first pin 32 and a second pin 33. The absolute value of the breakdown voltage of the bipolar junction transistor 30 is lower than that of the silicon-controlled rectifier 31 and the absolute value of the holding voltage of the bipolar junction transistor 30 is higher than that of the silicon-controlled rectifier 31 when an electrostatic discharge voltage is applied to the bipolar junction transistor 30 and the silicon-controlled rectifier 31. The bipolar junction transistor 30 and the silicon-controlled rectifier 31 have a first representative current-voltage curve when a positive electrostatic discharge voltage VE is applied to the bipolar junction transistor 30 and the silicon-controlled rectifier 31. The bipolar junction transistor 30 and the silicon-controlled rectifier 31 have a second representative current-voltage curve when a negative electrostatic discharge voltage VE is applied to the bipolar junction transistor 30 and the silicon-controlled rectifier 31. The electrostatic discharge current of the current-voltage curve is represented by IE. The first representative current-voltage curve is symmetric to the second representative current-voltage curve with zero voltage as a center, as illustrated by thick solid lines. Alternatively, the first representative current-voltage curve may be asymmetric to the second representative current-voltage curve with zero voltage as a center.

The bipolar junction transistor 30 has a representative current-voltage curve when an electrostatic discharge voltage VE is applied to the bipolar junction transistor 30, as illustrated by dash lines. The silicon-controlled rectifier 31 has a representative current-voltage curve when an electrostatic discharge voltage VE is applied to the silicon-controlled rectifier 31, as illustrate by thin solid lines. The bipolar junction transistor 30 has a lower breakdown voltage, a higher holding voltage, and a higher clamping voltage. The silicon-controlled rectifier 31 has a higher breakdown voltage, a lower holding voltage, and a lower clamping voltage. Combining with the properties of the bipolar junction transistor 30 and the silicon-controlled rectifier 31, the bidirectional ESD protection device 3 has a lower holding voltage and a lower clamping voltage that are still higher than the operating voltage of a protected device, when a required breakdown voltage is designed without sacrificing the ESD robustness and without suffering the latch-up event. Specifically, the first representative current-voltage curve has a first breakdown voltage Vb, a first holding voltage Vh, and a first clamping voltage Vc. The second representative current-voltage curve has a second breakdown voltage Vb', a second holding voltage Vh', and a second clamping voltage Vc'. The absolute values of the second breakdown voltage Vb', the second holding voltage Vh', and the second clamping voltage Vc' are respectively equal to the first breakdown voltage Vb, the first holding voltage Vh, and the first clamping voltage Vc. The bipolar junction transistor 30 is a bidirectional bipolar junction transistor, which means the bipolar junction transistor 30 has a breakdown voltage, a holding voltage, and a clamping voltage when a positive or negative electrostatic discharge voltage is applied to the bidirectional bipolar junction transistor. Likewise, the silicon-controlled rectifier 31 is a bidirectional silicon-controlled rectifier, which means the silicon-controlled rectifier has a breakdown voltage, a holding voltage, and a clamping voltage when a positive or negative electrostatic discharge voltage is applied to the bidirectional silicon-controlled rectifier.

The first breakdown voltage Vb is equal to the sum of the breakdown voltages of the bipolar junction transistor 30 and the silicon-controlled rectifier 31 when the positive electrostatic discharge voltage is applied to the bipolar junction transistor 30 and the silicon-controlled rectifier 31. The second breakdown voltage Vb' is equal to the sum of the breakdown voltages of the bipolar junction transistor 30 and the silicon-controlled rectifier 31 when the negative electrostatic discharge voltage is applied to the bipolar junction transistor 30 and the silicon-controlled rectifier 31. The first holding voltage Vh is equal to the sum of the holding voltages of the bipolar junction transistor 30 and the silicon-controlled rectifier 31 when the positive electrostatic discharge voltage is applied to the bipolar junction transistor 30 and the silicon-controlled rectifier 31. The second holding voltage Vh' is equal to the sum of the holding voltages of the bipolar junction transistor 30 and the silicon-controlled rectifier 31 when the negative electrostatic discharge voltage is applied to the bipolar junction transistor 30 and the silicon-controlled rectifier 31. The first clamping voltage Vc is equal to the sum of the clamping voltages of the bipolar junction transistor 30 and the silicon-controlled rectifier 31 when the positive electrostatic discharge voltage is applied to the bipolar junction transistor 30 and the silicon-controlled rectifier 31. The second clamping voltage Vc' is equal to the sum of the clamping voltages of the bipolar junction transistor 30 and the silicon-controlled rectifier 31 when the negative electrostatic discharge voltage is applied to the bipolar junction transistor 30 and the silicon-controlled rectifier 31. Hence, a lower clamping voltage and lower holding voltage that are still higher than the operating voltage of a protected device when a required breakdown voltage is designed without sacrificing the ESD robustness and suffering the latch-up event can be achieved by the bipolar junction transistor 30 and the silicon-controlled rectifier 31 that are coupled in series.

Figure 4:
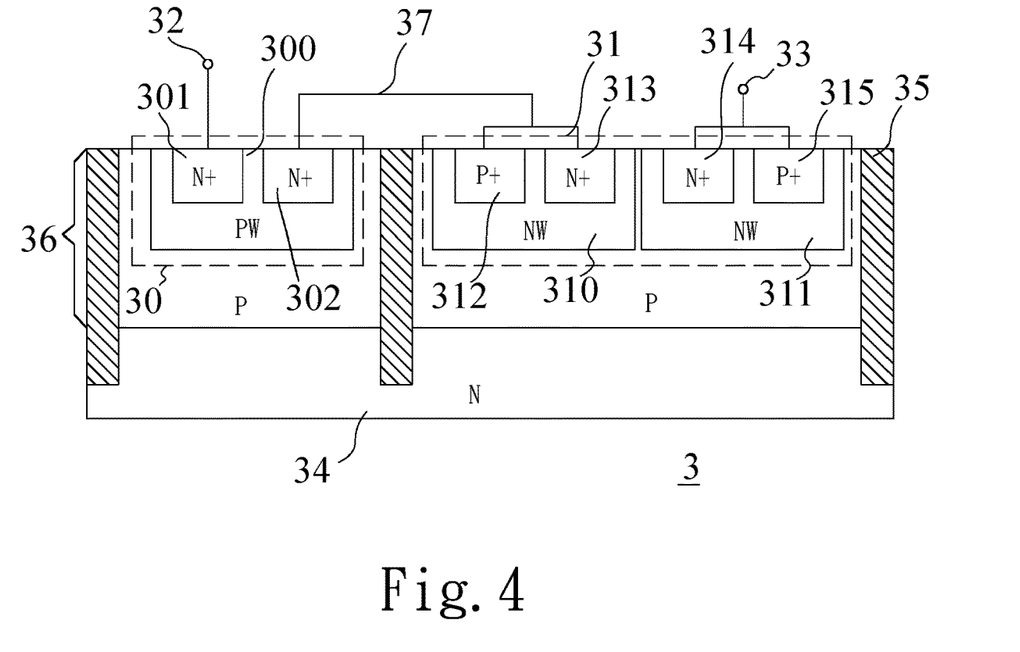
FIG. 4 is a cross-sectional view of a bidirectional ESD protection device according to a second embodiment of the present invention.

FIG. 4 is a cross-sectional view of a bidirectional ESD protection device according to a second embodiment of the present invention. Referring to FIG. 4, the bidirectional ESD protection device 3 further includes a semiconductor substrate 34 and an isolation structure 35. The semiconductor substrate 34 has a first conductivity type. An epitaxial layer 36 is formed on the semiconductor substrate 34. The epitaxial layer 36 has a second conductivity type opposite to the first conductivity type. In the second embodiment, the first conductivity type is an N type and the second conductivity type is a P type. The bipolar junction transistor 30, a first doped well 310, and at least one second doped well 311 are formed in the epitaxial layer 36. The first doped well 310 and the second doped well 311 have the first conductivity type. A first heavily-doped area 312 and a second heavily-doped area 313 are formed in the first doped well 310. The first heavily-doped area 312 and the second heavily-doped area 313 respectively have the second conductivity type and the first conductivity type. At least one third heavily-doped area 314 and at least one fourth heavily-doped area 315 are formed in the second doped well 311. For clarity and convenience, the second embodiment exemplifies one second doped well 311, one third heavily-doped area 314, and one fourth heavily-doped area 315. The third heavily-doped area 314 and the fourth heavily-doped area 315 respectively have the first conductivity type and the second conductivity type. The epitaxial layer 36, the first doped well 310, the second doped well 311, the first heavily-doped area 312, the second heavily-doped area 313, the third heavily-doped area 314, and the fourth heavily-doped area 315 form the silicon-controlled rectifier 31. The bipolar junction transistor 30 is coupled to the first heavily-doped area 312 and the second heavily-doped area 313 through an external conductive trace 37.

The isolation structure 35 includes an insulating material. The isolation structure 35, formed in the epitaxial layer 36 and between the silicon-controlled rectifier 31 and the bipolar junction transistor 30, directly touches the semiconductor substrate 34 and separates the silicon-controlled rectifier 31 from the bipolar junction transistor 30. That is to say, there is nothing between the isolation structure 35 and the semiconductor substrate 34. For example, the isolation structure 35 may be formed in the semiconductor substrate 34. In other words, the bottom position of the isolation structure 35 is equal to or deeper than that of the epitaxial layer 36. Besides, the isolation structure 35 may surround the silicon-controlled rectifier 31 and the bipolar junction transistor 30. The bipolar junction transistor 30 may include at least one third doped well 300, at least one fifth heavily-doped area 301, and at least one sixth heavily-doped area 302. For clarity and convenience, the second embodiment exemplifies one third doped well 300, one fifth heavily-doped area 301, and one sixth heavily-doped area 302. The fifth heavily-doped area 301 is coupled to the first pin 32 and the third heavily-doped area 314 and the fourth heavily-doped area 315 are coupled to the second pin 33. In the second embodiment, the third doped well 300, the fifth heavily-doped area 301, and the sixth heavily-doped area 302 may be respectively a P-type doped well, an N-type heavily-doped area, and an N-type heavily-doped area.

The operation of the bidirectional ESD protection device 3 of the second embodiment is introduced as follows. An electrostatic discharge current sequentially flows through the fifth heavily-doped area 301, the third doped well 300, the sixth heavily-doped area 302, the external conductive trace 37, the first heavily-doped area 312, the first doped well 310, the epitaxial layer 36, the second doped well 311, and the third heavily-doped area 314 when the positive electrostatic discharge voltage is applied to the first pin 32 and the second pin 33. The path passing through the external conductive trace 37 is called a first current path. The interface between the fifth heavily-doped area 301 and the third doped well 300 and the interface between the first doped well 310 and the epitaxial layer 36 are used as breakdown interfaces. The breakdown voltage of the interface between the fifth heavily-doped area 301 and the third doped well 300 is lower than the breakdown voltage of the interface between the first doped well 310 and the epitaxial layer 36 since the energy bandgap of the interface between the fifth heavily-doped area 301 and the third doped well 300 is less than the energy bandgap of the interface between the first doped well 310 and the epitaxial layer 36. The electrostatic discharge current also sequentially flows through the fifth heavily-doped area 301, the third doped well 300, the epitaxial layer 36, the semiconductor substrate 34, the epitaxial layer 36, the second doped well 311, and the third heavily-doped area 314 when the positive electrostatic discharge voltage is applied to the first pin 32 and the second pin 33. The path passing through the semiconductor substrate 34 is called a second current path. However, the second current path is suppressed since the second current path is longer than the first current path.

An electrostatic discharge current sequentially flows through the fourth heavily-doped area 315, the second doped well 311, the epitaxial layer 36, the first doped well 310, the second heavily-doped area 313, the external conductive trace 37, the sixth heavily-doped area 302, the third doped well 300, and the fifth heavily-doped area 301 when the negative electrostatic discharge voltage is applied to the first pin 32 and the second pin 33. The path passing through the external conductive trace 37 is called a first current path. The interface between the sixth heavily-doped area 302 and the third doped well 300 and the interface between the second doped well 311 and the epitaxial layer 36 are used as breakdown interfaces. The breakdown voltage of the interface between the sixth heavily-doped area 302 and the third doped well 300 is lower than the breakdown voltage of the interface between the second doped well 311 and the epitaxial layer 36 since the energy bandgap of the interface between the sixth heavily-doped area 302 and the third doped well 300 is less than the energy bandgap of the interface between the second doped well 311 and the epitaxial layer 36. The electrostatic discharge current also sequentially flows through the fourth heavily-doped area 315, the second doped well 311, the epitaxial layer 36, the semiconductor substrate 34, the epitaxial layer 36, the third doped well 300, and the fifth heavily-doped area 301 when the negative electrostatic discharge voltage is applied to the first pin 32 and the second pin 33. The path passing through the semiconductor substrate 34 is called a second current path. However, the second current path is suppressed since the second current path is longer than the first current path.

Figure 5:
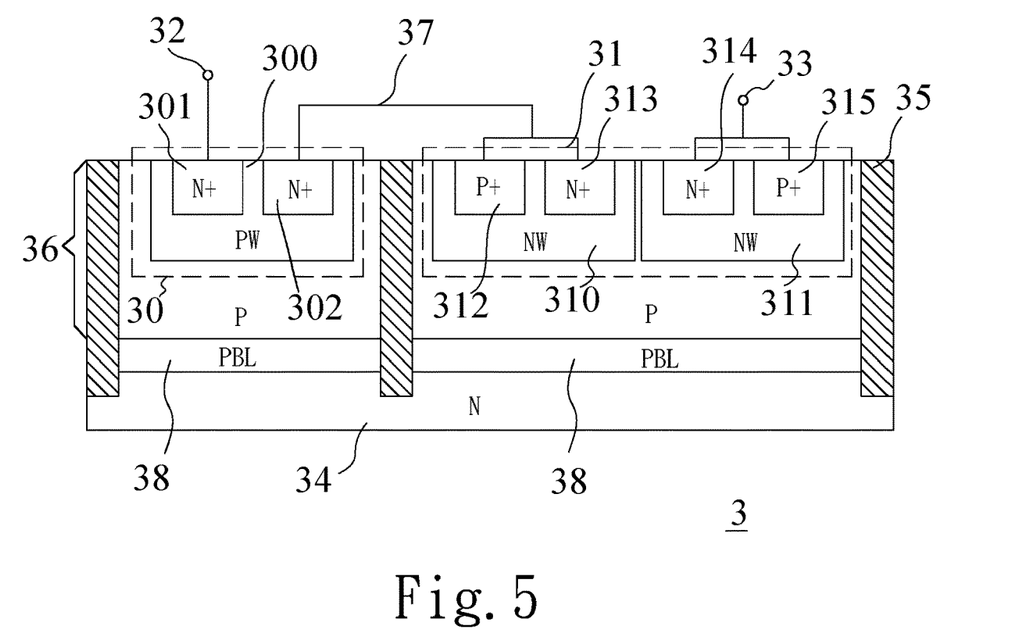
FIG. 5 is a cross-sectional view of a bidirectional ESD protection device according to a third embodiment of the present invention.

FIG. 5 is a cross-sectional view of a bidirectional ESD protection device according to a third embodiment of the present invention. Referring to FIG. 5, the third embodiment is different from the second embodiment in the third embodiment further includes a heavily-doped buried layer 38 formed between the semiconductor substrate 34 and the epitaxial layer 36 and formed under the bipolar junction transistor 30 and the silicon-controlled rectifier 31. The heavily-doped buried layer 38 has the second conductivity type. The isolation structure 35 penetrates through the heavily-doped buried layer 38. The doping concentration of the heavily-doped buried layer 38 is greater than that of the epitaxial layer 36.

The electrostatic discharge current sequentially flows through the fifth heavily-doped area 301, the third doped well 300, the epitaxial layer 36, the heavily-doped buried layer 38, the semiconductor substrate 34, the heavily-doped buried layer 38, the epitaxial layer 36, the second doped well 311, and the third heavily-doped area 314 when the positive electrostatic discharge voltage is applied to the first pin 32 and the second pin 33. This current path is greatly suppressed since the doping concentration of the heavily-doped buried layer 38 is higher than that of the epitaxial layer 36. In other words, the heavily-doped buried layer 38 greatly suppresses the current gain of this current path. Similarly, the electrostatic discharge current sequentially flows through the fourth heavily-doped area 315, the second doped well 311, the epitaxial layer 36, the heavily-doped buried layer 38, the semiconductor substrate 34, the heavily-doped buried layer 38, the epitaxial layer 36, the third doped well 300, and the fifth heavily-doped area 301 when the negative electrostatic discharge voltage is applied to the first pin 32 and the second pin 33. This current path is also greatly suppressed.

Figure 6:
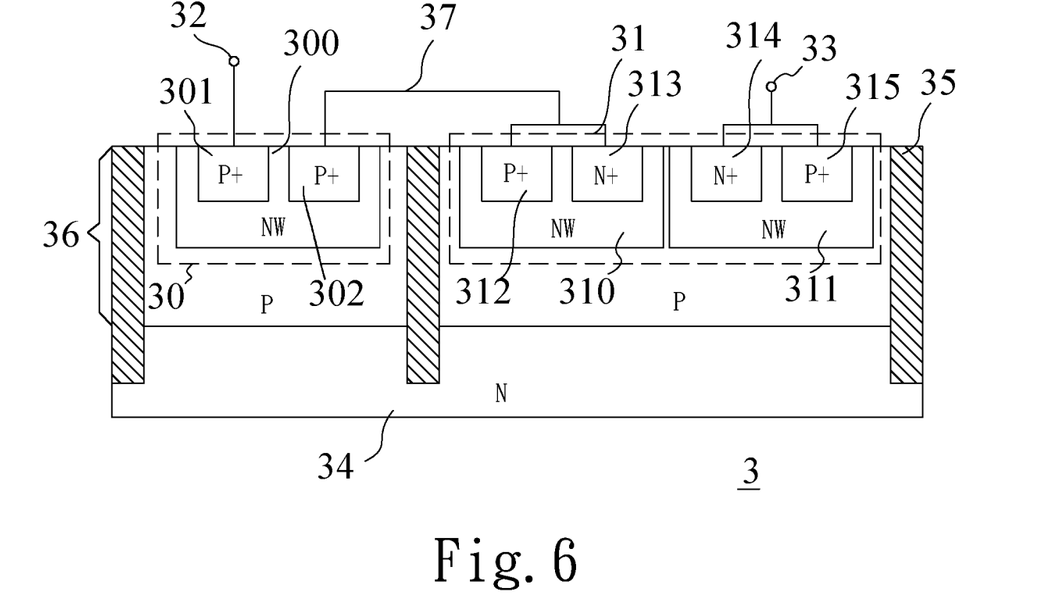
FIG. 6 is a cross-sectional view of a bidirectional ESD protection device according to a fourth embodiment of the present invention.

FIG. 6 is a cross-sectional view of a bidirectional ESD protection device according to a fourth embodiment of the present invention. Referring to FIG. 6, the fourth embodiment is different from the second embodiment in that the bipolar junction transistor 30. In the fourth embodiment, the third doped well 300, the fifth heavily-doped area 301, and the sixth heavily-doped area 302 may be respectively an N-type doped well, a P-type heavily-doped area, and a P-type heavily-doped area. The other structures of the fourth embodiment have been described in the second embodiment so will not be reiterated. The interface between the sixth heavily-doped area 302 and the third doped well 300 and the interface between the first doped well 310 and the epitaxial layer 36 are used as breakdown interfaces. The breakdown voltage of the interface between the sixth heavily-doped area 302 and the third doped well 300 is lower than the breakdown voltage of the interface between the first doped well 310 and the epitaxial layer 36 since the energy bandgap of the interface between the sixth heavily-doped area 302 and the third doped well 300 is less than the energy bandgap of the interface between the first doped well 310 and the epitaxial layer 36.

Figure 7:
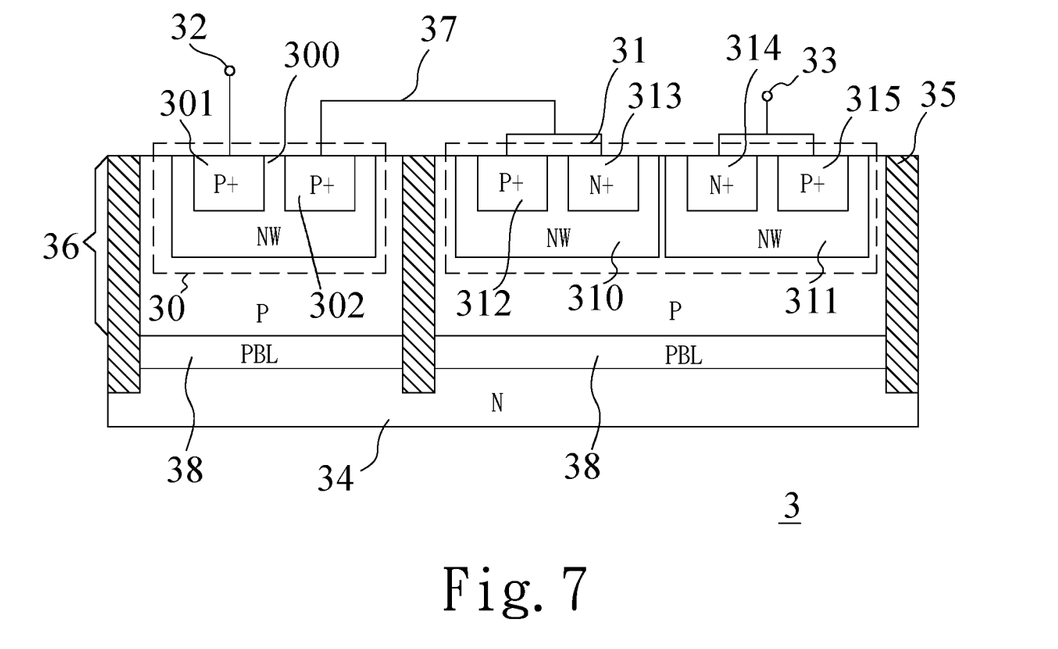
FIG. 7 is a cross-sectional view of a bidirectional ESD protection device according to a fifth embodiment of the present invention.

FIG. 7 is a cross-sectional view of a bidirectional ESD protection device according to a fifth embodiment of the present invention. Referring to FIG. 7, the fifth embodiment is different from the third embodiment in that the bipolar junction transistor 30. In the fifth embodiment, the third doped well 300, the fifth heavily-doped area 301, and the sixth heavily-doped area 302 may be respectively an N-type doped well, a P-type heavily-doped area, and a P-type heavily-doped area. The other structures of the fifth embodiment have been described in the third embodiment so will not be reiterated.

Figure 8:
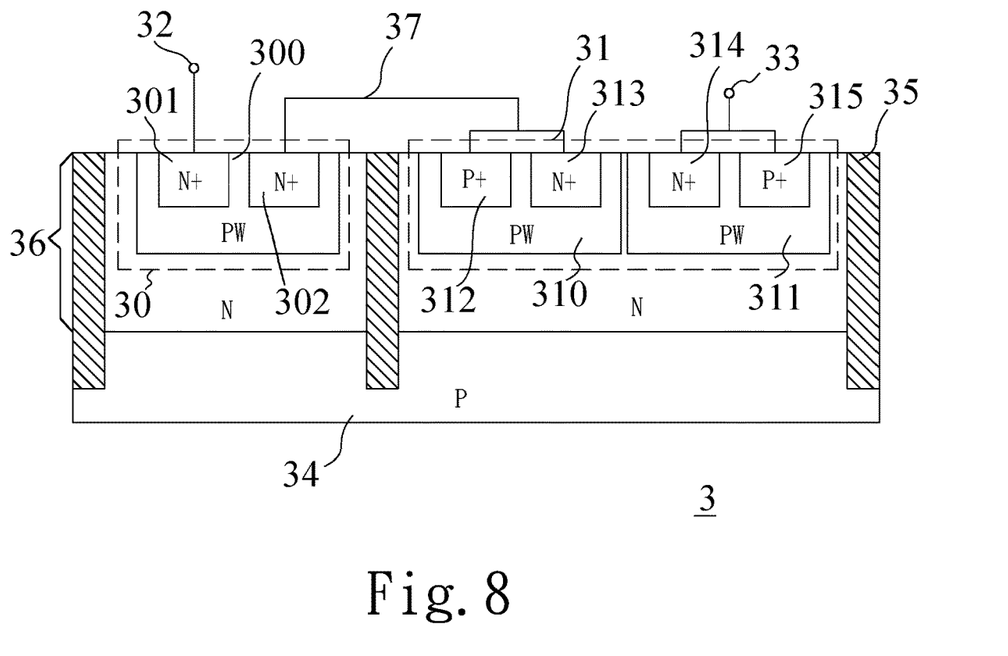
FIG. 8 is a cross-sectional view of a bidirectional ESD protection device according to a sixth embodiment of the present invention.

FIG. 8 is a cross-sectional view of a bidirectional ESD protection device according to a sixth embodiment of the present invention. The sixth embodiment is merely different from the second embodiment in the conductivity types of the semiconductor substrate 34, the epitaxial layer 36, the first doped well 310, and the second doped well 311. The first conductivity type and the second conductivity type of the sixth embodiment are respectively a P type and an N type. The other structures of the sixth embodiment have been described in the second embodiment so will not be reiterated.

Figure 9:
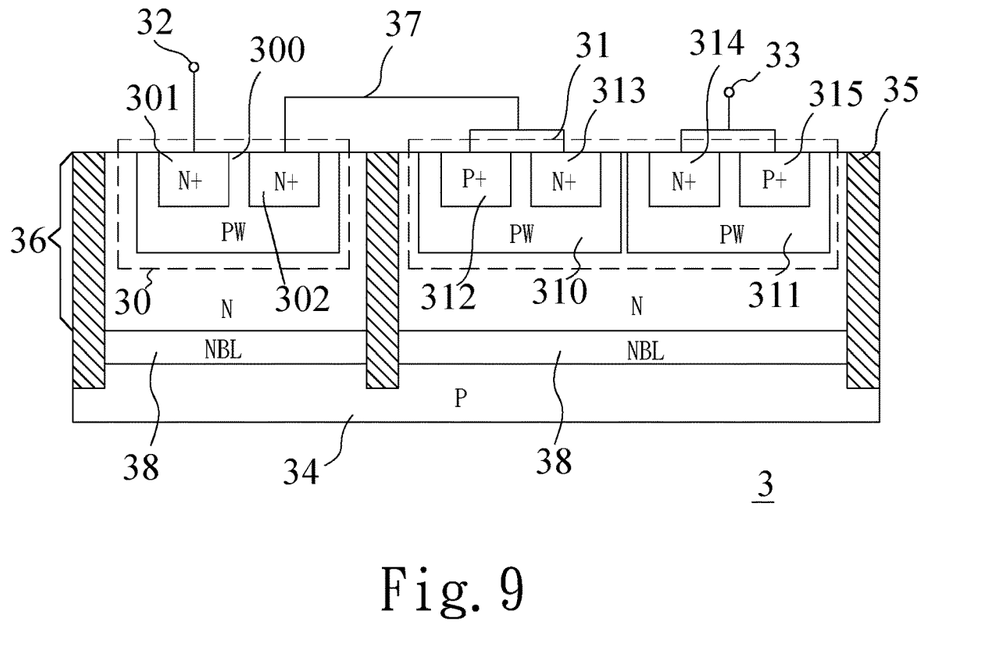
FIG. 9 is a cross-sectional view of a bidirectional ESD protection device according to a seventh embodiment of the present invention.

FIG. 9 is a cross-sectional view of a bidirectional ESD protection device according to a seventh embodiment of the present invention. The seventh embodiment is merely different from the third embodiment in the conductivity types of the semiconductor substrate 34, the epitaxial layer 36, the first doped well 310, the heavily-doped buried layer 38, and the second doped well 311. The first conductivity type and the second conductivity type of the seventh embodiment are respectively a P type and an N type. The other structures of the seventh embodiment have been described in the third embodiment so will not be reiterated.

Figure 10:
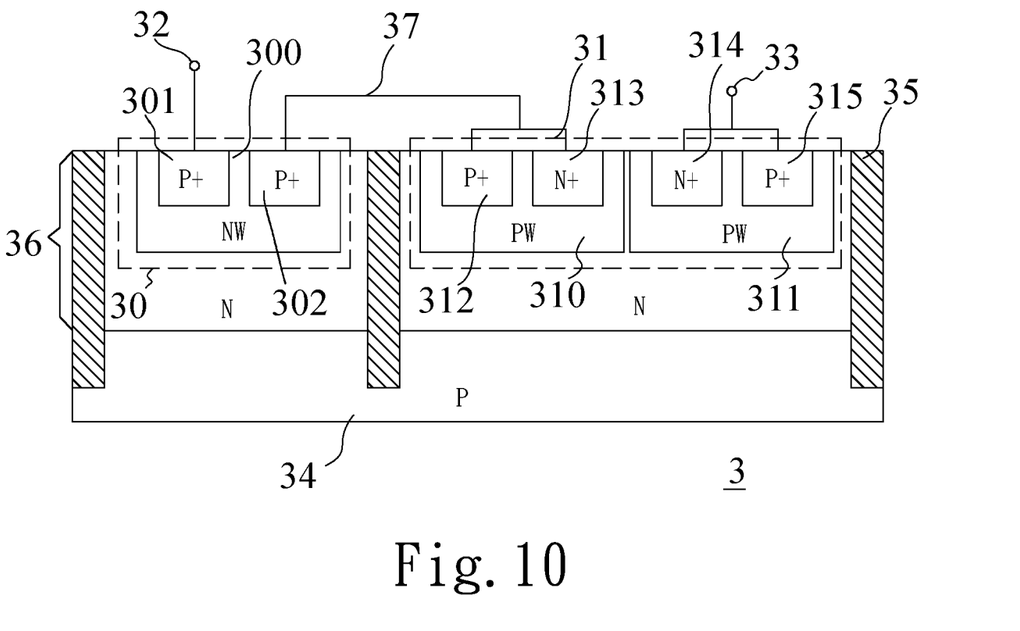
FIG. 10 is a cross-sectional view of a bidirectional ESD protection device according to an eighth embodiment of the present invention.

FIG. 10 is a cross-sectional view of a bidirectional ESD protection device according to an eighth embodiment of the present invention. The eighth embodiment is merely different from the fourth embodiment in the conductivity types of the semiconductor substrate 34, the epitaxial layer 36, the first doped well 310, and the second doped well 311. The first conductivity type and the second conductivity type of the eighth embodiment are respectively a P type and an N type. The other structures of the eighth embodiment have been described in the fourth embodiment so will not be reiterated.

Figure 11:
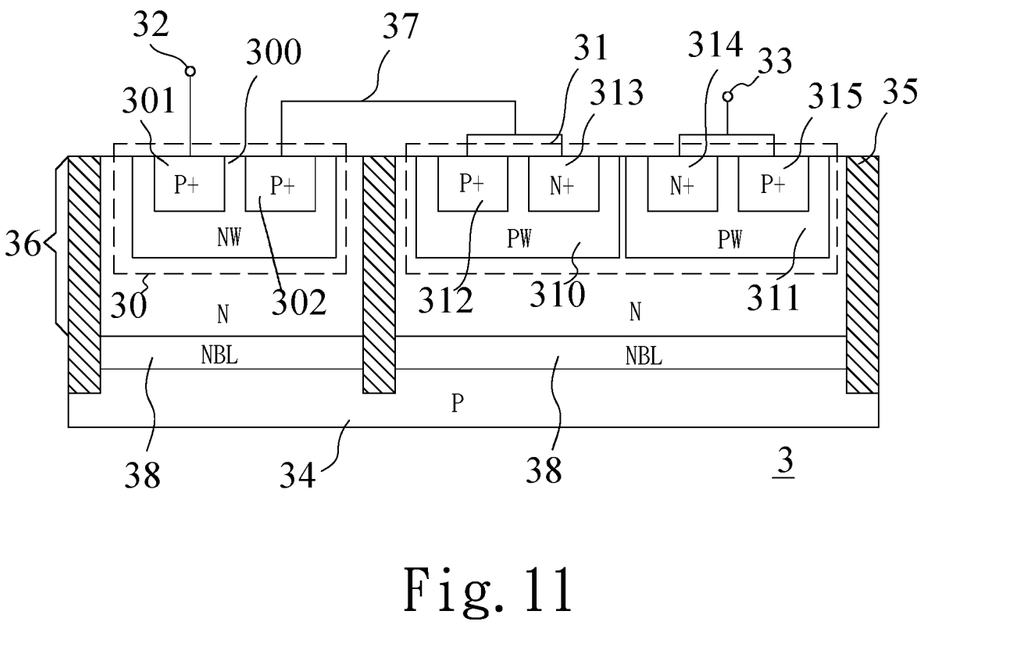
FIG. 11 is a cross-sectional view of a bidirectional ESD protection device according to a ninth embodiment of the present invention.

FIG. 11 is a cross-sectional view of a bidirectional ESD protection device according to a ninth embodiment of the present invention. The ninth embodiment is merely different from the fifth embodiment in the conductivity types of the semiconductor substrate 34, the epitaxial layer 36, the first doped well 310, the heavily-doped buried layer 38, and the second doped well 311. The first conductivity type and the second conductivity type of the ninth embodiment are respectively a P type and an N type. The other structures of the ninth embodiment have been described in the fifth embodiment so will not be reiterated. In conclusion, the bidirectional ESD protection device couples the bipolar junction transistor to the silicon-controlled rectifier in series to have a lower clamping voltage and a lower holding voltage that are still higher than the operating voltage of a protected device when a required breakdown voltage is designed without sacrificing the ESD robustness and without suffering the latch-up event.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A bidirectional electrostatic discharge (ESD) protection device comprising:
   at least one bipolar junction transistor; and
   at least one silicon-controlled rectifier coupled to the at least one bipolar junction transistor in series, wherein an absolute value of a breakdown voltage of the at least one bipolar junction transistor is lower than that of the at least one silicon-controlled rectifier and an absolute value of a holding voltage of the at least one bipolar junction transistor is higher than that of the at least one silicon-controlled rectifier when an electrostatic discharge voltage is applied to the at least one bipolar junction transistor and the at least one silicon-controlled rectifier.

2. The bidirectional electrostatic discharge protection device according to claim 1, wherein the at least one bipolar junction transistor and the at least one silicon-controlled rectifier have a first representative current-voltage curve when a positive electrostatic discharge voltage is applied to the at least one bipolar junction transistor and the at least one silicon-controlled rectifier, the at least one bipolar junction transistor and the at least one silicon-controlled rectifier have a second representative current-voltage curve when a negative electrostatic discharge voltage is applied to the at least one bipolar junction transistor and the at least one silicon-controlled rectifier, the first representative current-voltage curve is symmetric or asymmetric to the second representative current-voltage curve with zero voltage as a center.

3. The bidirectional electrostatic discharge protection device according to claim 2, wherein the first representative current-voltage curve has a first breakdown voltage, a first holding voltage, and a first clamping voltage, the second representative current-voltage curve has a second breakdown voltage, a second holding voltage, and a second clamping voltage, and absolute values of the second breakdown voltage, the second holding voltage, and the second clamping voltage are respectively equal to the first breakdown voltage, the first holding voltage, and the first clamping voltage.

4. The bidirectional electrostatic discharge protection device according to claim 1, further comprising:
   a semiconductor substrate having a first conductivity type, an epitaxial layer is formed on the semiconductor substrate, the epitaxial layer has a second conductivity type opposite to the first conductivity type, the at least one bipolar junction transistor, a first doped well, and at least one second doped well are formed in the epitaxial layer, the first doped well and the at least one second doped well have the first conductivity type, a first heavily-doped area and a second heavily-doped area are formed in the first doped well, the first heavily-doped area and the second heavily-doped area respectively have the second conductivity type and the first conductivity type, at least one third heavily-doped area and at least one fourth heavily-doped area are formed in the at least one second doped well, the at least one third heavily-doped area and the at least one fourth heavily-doped area respectively have the first conductivity type and the second conductivity type, the epitaxial layer, the first doped well, the at least one second doped well, the first heavily-doped area, the second heavily-doped area, the at least one third heavily-doped area, and the at least one fourth heavily-doped area form the at least one silicon-controlled rectifier, and the at least one bipolar junction transistor is coupled to the first heavily-doped area and the second heavily-doped area through an external conductive trace; and
   an isolation structure, formed in the epitaxial layer and between the at least one silicon-controlled rectifier and the at least one bipolar junction transistor, touching the semiconductor substrate and separating the at least one silicon-controlled rectifier from the at least one bipolar junction transistor, wherein a bottom position of the isolation structure is equal to or deeper than that of the epitaxial layer.

5. The bidirectional electrostatic discharge protection device according to claim 4, wherein the isolation structure is formed in the semiconductor substrate.

6. The bidirectional electrostatic discharge protection device according to claim 4, wherein the isolation structure surrounds the at least one silicon-controlled rectifier and the at least one bipolar junction transistor.

7. The bidirectional electrostatic discharge protection device according to claim 4, further comprising a heavily-doped buried layer formed between the semiconductor substrate and the epitaxial layer and formed under the at least one bipolar junction transistor and the at least one silicon-controlled rectifier, wherein the heavily-doped buried layer has the second conductivity type, and the isolation structure penetrates through the heavily-doped buried layer.

8. The bidirectional electrostatic discharge protection device according to claim 4, wherein the first conductivity type is an N type and the second conductivity type is a P type.

9. The bidirectional electrostatic discharge protection device according to claim 4, wherein the first conductivity type is a P type and the second conductivity type is an N type.

10. The bidirectional electrostatic discharge protection device according to claim 4, wherein the at least one bipolar junction transistor comprises:
    at least one third doped well formed in the epitaxial layer; and
    at least one fifth heavily-doped area and at least one sixth heavily-doped area formed in the at least one third doped well, wherein conductivity types of the at least one fifth heavily-doped area and the at least one sixth heavily-doped area are opposite to a conductivity type of the at least one third doped well, and the at least one sixth heavily-doped area is coupled to the external conductive trace.

11. The bidirectional electrostatic discharge protection device according to claim 10, wherein the at least one fifth heavily-doped area is coupled to a first pin and the at least one third heavily-doped area and the at least one fourth heavily-doped area are coupled to a second pin.

12. The bidirectional electrostatic discharge protection device according to claim 11, wherein an electrostatic discharge current sequentially flows through the at least one fifth heavily-doped area, the at least one third doped well, the at least one sixth heavily-doped area, the external conductive trace, the first heavily-doped area, the first doped well, the epitaxial layer, the at least one second doped well, and the at least one third heavily-doped area when the positive electrostatic discharge voltage is applied to the first pin and the second pin.

13. The bidirectional electrostatic discharge protection device according to claim 11, wherein an electrostatic discharge current sequentially flows through the at least one fourth heavily-doped area, the at least one second doped well, the epitaxial layer, the first doped well, the second heavily-doped area, the external conductive trace, the at least one sixth heavily-doped area, the at least one third doped well, and the at least one fifth heavily-doped area when the negative electrostatic discharge voltage is applied to the first pin and the second pin.

14. The bidirectional electrostatic discharge protection device according to claim 1, wherein the at least one bipolar junction transistor comprises a plurality of bipolar junction transistors.

15. The bidirectional electrostatic discharge protection device according to claim 1, wherein the at least one silicon-controlled rectifier comprises a plurality of silicon-controlled rectifiers.

* * * * *